(12) United States Patent
Chu et al.

(10) Patent No.: US 12,494,423 B2
(45) Date of Patent: Dec. 9, 2025

(54) SEMICONDUCTOR DEVICE INCLUDING STACKED VIA CONTACT AND METHOD FOR MANUFACTURING THE SAME

(71) Applicant: TAIWAN SEMICONDUCTOR MANUFACTURING COMPANY, LTD., Hsinchu (TW)

(72) Inventors: Chia-Hung Chu, Hsinchu (TW); Po-Chin Chang, Hsinchu (TW); Tzu-Pei Chen, Hsinchu (TW); Yuting Cheng, Hsinchu (TW); Kan-Ju Lin, Hsinchu (TW); Chih-Shiun Chou, Hsinchu (TW); Hung-Yi Huang, Hsinchu (TW); Pinyen Lin, Hsinchu (TW); Sung-Li Wang, Hsinchu (TW); Sheng-Tsung Wang, Hsinchu (TW); Lin-Yu Huang, Hsinchu (TW); Shao-An Wang, Hsinchu (TW); Harry Chien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 659 days.

(21) Appl. No.: 17/668,482

(22) Filed: Feb. 10, 2022

(65) Prior Publication Data
US 2023/0253308 A1  Aug. 10, 2023

(51) Int. Cl.
*H01L 21/768* (2006.01)
*H01L 23/522* (2006.01)
(Continued)

(52) U.S. Cl.
CPC .... *H01L 23/5226* (2013.01); *H01L 21/76814* (2013.01); *H01L 21/76816* (2013.01);
(Continued)

(58) Field of Classification Search
CPC ........... H01L 23/5226; H01L 21/76814; H01L 21/76816; H01L 21/76843; H01L 21/76871; H01L 23/5283; H01L 29/41775; H01L 29/42356; H01L 21/76847; H01L 21/76868; H01L 21/76877; H01L 21/823475; H01L 23/485; H01L 21/76807; H10D 64/258; H10D 64/512
See application file for complete search history.

(56) References Cited

U.S. PATENT DOCUMENTS

10,964,792 B1 * 3/2021 Cheng ................... H01L 23/485
2008/0150142 A1 * 6/2008 Saito .................. H01L 21/76883
(Continued)

*Primary Examiner* — Suberr L Chi
(74) *Attorney, Agent, or Firm* — Birch, Stewart, Kolasch & Birch, LLP (57) ABSTRACT

A method for manufacturing a semiconductor device includes forming a conductive feature in a first dielectric layer; forming a second dielectric layer on the first dielectric layer; forming a trench that penetrates through the second dielectric layer, and terminates at the conductive feature; forming a contact layer in the trench and on the conductive feature; etching back the contact layer to form a first via contact feature in the trench, the first via contact feature being electrically connected to the conductive feature; and forming a second via contact feature on the first via contact feature in the trench.

20 Claims, 11 Drawing Sheets

(51) Int. Cl.
*H01L 23/528* (2006.01)
*H10D 64/23* (2025.01)
*H10D 64/27* (2025.01)

(52) U.S. Cl.
CPC .. *H01L 21/76843* (2013.01); *H01L 21/76871* (2013.01); *H01L 23/5283* (2013.01); *H10D 64/258* (2025.01); *H10D 64/512* (2025.01)

(56) References Cited

U.S. PATENT DOCUMENTS

| | | | |
|---|---|---|---|
| 2017/0084483 A1* | 3/2017 | Yang | H01L 21/76844 |
| 2020/0118870 A1* | 4/2020 | van der Straten | H01L 21/2855 |
| 2020/0135641 A1* | 4/2020 | Lee | H01L 23/5228 |
| 2020/0168720 A1* | 5/2020 | Kwak | H10B 10/12 |
| 2021/0375776 A1* | 12/2021 | Ho | H01L 21/76849 |

* cited by examiner

SEMICONDUCTOR DEVICE INCLUDING STACKED VIA CONTACT AND METHOD FOR MANUFACTURING THE SAME

BACKGROUND

There has been tremendous technological growth in the semiconductor industry over the past decades. As a semiconductor device is scaled down, the aspect ratio of a via (for example, via to metal gate (VG) or via to source/drain (VD)) increases due to the smaller size thereof, which may cause formation of defects (for example, a void, a seam or a groove) in a via contact. Therefore, there is a need to reduce the formation of defects in the via contact.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "above," "below," "proximate," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
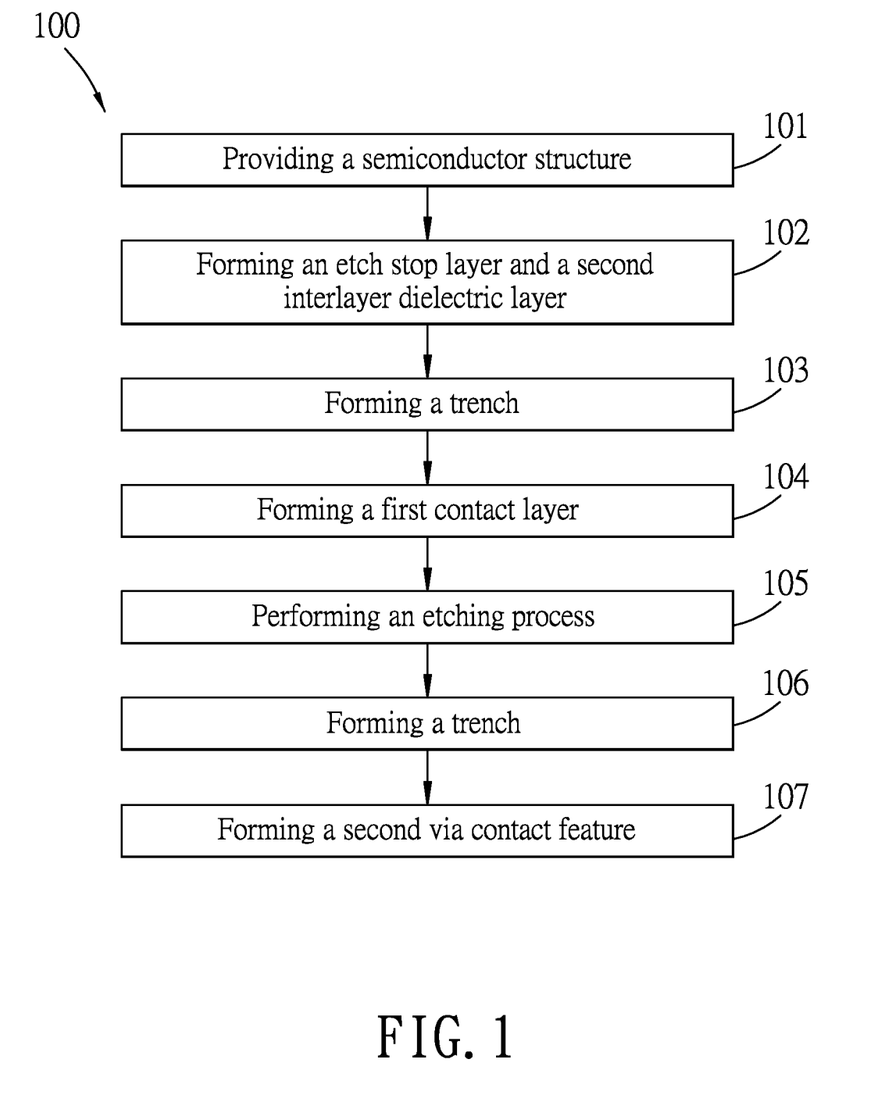
FIG. 1 is a flow diagram illustrating a method for manufacturing a semiconductor device in accordance with some embodiments.

FIG. 1 is a flow diagram illustrating a method 100 for manufacturing a semiconductor device (for example, a semiconductor device 200 shown in FIG. 10) in accordance with some embodiments. FIGS. 2 to 10 illustrate schematic views of the intermediate stages of the method 100.

Figure 2:
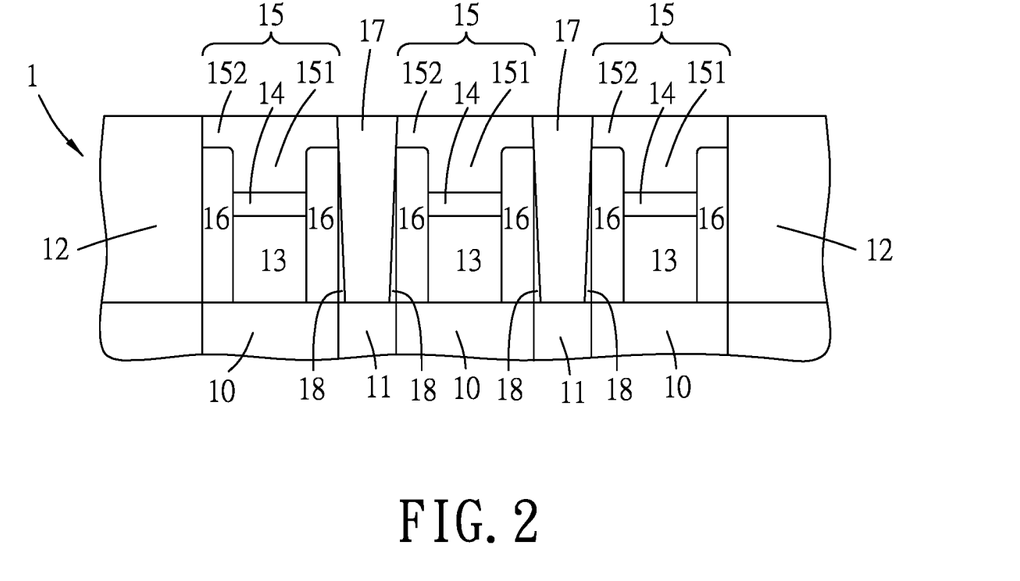
FIGS. 2 to 10 are schematic views illustrating intermediate stages of a method for manufacturing the semiconductor device in accordance with some embodiments.

Referring to FIGS. 1 and 2, the method 100 begins at step 101, where a semiconductor structure 1 is provided. The semiconductor structure 1 includes: a semiconductor substrate 10; source/drain (S/D) regions 11 (i.e., active regions) disposed in the semiconductor substrate 10; a first interlayer dielectric (ILD) layer 12 disposed on the semiconductor substrate 10 and the S/D regions 11; metal gates 13 disposed in the first ILD layer 12 and on the semiconductor substrate 10, and each of which is disposed between corresponding two of the S/D regions 11; metal caps 14 disposed on the metal gates 13, respectively; self-aligned contacts (SACs) 15 disposed on the metal caps 14 opposite to the metal gates 13, respectively; gate spacers 16 disposed in the first ILD layer 12 to laterally cover the metal gates 13 and bottom portions 151 of the SACs 15; metal contacts 17 formed in the first ILD layer 12 and disposed on the S/D regions 11, respectively; and contact spacers 18 disposed in the first ILD layer 12 to laterally cover the metal contacts 17.

In some embodiments, the semiconductor substrate 10 may include, but not limited to, an elemental semiconductor or a compound semiconductor. The elemental semiconductor includes a single species of atoms, such as silicon (Si) or germanium (Ge) in column XIV of the periodic table, and may be in crystal, polycrystalline, or an amorphous structure. Other suitable materials for the elemental semiconductor are within the contemplated scope of the present disclosure. The compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials for the compound semiconductor are within the contemplated scope of the present disclosure. The compound semiconductor may have a gradient feature in which the compositional ratio thereof changes from one location to another location in the compound semiconductor. The compound semiconductor may be formed over a silicon substrate and may be strained. In some embodiments, the semiconductor substrate 10 may include a multilayer compound semiconductor structure. In some embodiments, the semiconductor substrate 10 may be a semiconductor-on-insulator (SOI) (e.g., silicon germanium-on-insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron, aluminum, or gallium. Other suitable materials are within the contemplated scope of the present disclosure. Alternatively, the SOI substrate may be doped with an N-type dopant, for example, but not limited to, nitrogen, phosphorous, or arsenic. Other suitable materials are within the contemplated scope of the present disclosure.

In some embodiments, the S/D regions 11 may be formed by epitaxially growing a layer of a semiconductor material using a selective epitaxial growth (SEG) process. The S/D regions 11 may be, for example, but not limited to, crystalline silicon (or other suitable semiconductor materials) in-situ doped with a P-type impurity during the SEG process, so as to form P-type S/D regions for PMOS (P-type metal oxide semiconductor) transistors. The P-type impurity may be, for example, but not limited to, boron, aluminum, gallium, indium, boron fluoride, other suitable materials, or combinations thereof. The S/D regions 11 may include one or multiple layers of the semiconductor material. In some embodiments, the S/D regions 11 may be fabricated by forming a SiGe alloy layer using the SEG process and then forming a Si cap layer on top of the SiGe alloy layer, followed by implanting a P-type lightly doped grain (for example, but not limited to, boron, aluminum, gallium, indium, boron fluoride, other suitable materials, or combinations thereof) so as to form the P-type S/D regions. In some embodiments, the S/D regions 11 may be, for example, but not limited to, crystalline silicon (or other suitable semiconductor materials) in-situ doped with an N-type impurity during the SEG process, so as to form N-type S/D regions for NMOS (N-type metal oxide semiconductor) transistors. The N-type impurity may be, for example, but not limited to, phosphorous, nitrogen, arsenic, antimony, other suitable materials, or combinations thereof. In some embodiments, the S/D regions 11 may be fabricated by forming a SiGe alloy layer using the SEG process and then forming a Si cap layer on top of the SiGe alloy layer, followed by implanting an N-type lightly doped grain (for example, but not limited to, phosphorous, nitrogen, arsenic, antimony, other suitable materials, or combinations thereof) so as to form the N-type S/D regions.

In some embodiments, a material for the first ILD layer 12 may include, but not limited to, lanthanum oxide, aluminum oxide, yttrium oxide, tantalum carbonitride, zirconium silicide, silicon oxycarbonitride, silicon oxycarbide, silicon carbonitride, zirconium nitride, zirconium aluminum oxide, titanium oxide, tantalum oxide, zirconium oxide, hafnium oxide, hafnium silicide, aluminum oxynitride, silicon nitride, silicon oxide, silicon carbide, zinc oxide, or combinations thereof. Other suitable materials for the first ILD layer 12 are within the contemplated scope of the present disclosure. In some embodiments, the first ILD layer 12 may be formed by a suitable deposition process, for example, but not limited to, chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), or low-pressure chemical vapor deposition (LPCVD).

In some embodiments, each of the metal gates 13 is made of aluminum, copper, tungsten, a metal alloy, a metal silicide, other conductive materials, or combinations thereof. In some embodiments, a gate dielectric (not shown) is disposed between each of the metal gates 13 and the semiconductor substrate 10. In some embodiments, each of the metal gates 13 may include several layers, for example, but not limited to, a blocking/wetting layer, a work function layer, and a conductive layer. The blocking/wetting layer prevents or reduces metal impurities from penetrating into any dielectric layers (e.g., the gate dielectric) disposed below the blocking/wetting layer, and also provides the desirable interface quality between the blocking/wetting layer and any material layer formed over the blocking/wetting layer. In some embodiments, the blocking/wetting layer includes, for example, but not limited to, titanium aluminum nitride (TiAlN), other suitable metal nitrides, titanium aluminum carbonitride (TiAlCN), other suitable metal carbonitrides, or combinations thereof. The work function layer includes a material which is used to tune some work function values of the metal gate 13. In some embodiments, the work function layer may include titanium aluminum carbonitride which has a composition that is different from that of the titanium aluminum carbonitride of the blocking/wetting layer. In some embodiments, the conductive layer includes aluminum, copper, tungsten, a metal alloy, a metal silicide, other conductive materials, or combinations thereof. The gate dielectric disposed between each of the metal gates 13 and the semiconductor substrate 10 may be a high-k dielectric layer. In some embodiments, the gate dielectric may include hafnium oxide (HfO), hafnium silicon oxide (HfSiO), hafnium silicon oxynitride (HfSiON), hafnium tantalum oxide (HfTaO), hafnium titanium oxide (HMO), hafnium zirconium oxide (HfZrO), metal oxides, metal nitrides, metal silicates, metal oxynitrides, metal aluminates, transition metal nitrides, transition metal silicates, transition metal oxides, silicon oxide, silicon nitride, silicon oxynitride, zirconium silicate, zirconium aluminate, other suitable high-k dielectric materials, or combinations thereof. Examples of metal oxides for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. In some embodiments, an interfacial layer may be disposed below the gate dielectric to reduce damage between the gate dielectric and the semiconductor substrate 10. The interfacial layer may include silicon oxide.

In some embodiments, the metal caps 14 may include, but not limited to, tungsten, cobalt, ruthenium, titanium nitride, or fluorine-free tungsten (FFW). Other suitable materials for the metal caps 14 are within the contemplated scope of the present disclosure. In some embodiments, the metal caps 14 may be formed by a suitable deposition process, for example, but not limited to, CVD, PVD, or ALD. In some embodiments, each of the metal caps 14 may have a thickness ranging from about 1 nm to about 10 nm. If the thickness of each of the metal caps 14 is too small, such as smaller than about 1 nm, the desired function for protecting the underlying metal gate 13 may not be achieved. If the thickness of each of the metal caps 14 is too large, such as larger than about 10 nm, the metal caps 14 may occupy too much space in the semiconductor structure 1.

In some embodiments, the SACs 15 may include, but not limited to, lanthanum oxide, aluminum oxide, yttrium oxide, tantalum carbonitride, zirconium silicide, silicon oxycarbonitride, silicon oxycarbide, silicon carbonitride, silicon oxynitride (optionally doped with carbon), zirconium nitride, zirconium aluminum oxide, titanium oxide, tantalum oxide, zirconium oxide, hafnium oxide, hafnium silicide, aluminum oxynitride, silicon nitride optionally doped with a dopant, silicon oxide, silicon carbide, zinc oxide, boron nitride, boron carbide, and other low-k dielectric materials or low-k dielectric materials doped with one or more of carbon, nitrogen, and hydrogen, or combinations thereof. Other suitable materials for the SACs 15 are within the contemplated scope of the present disclosure. In some embodiments, the SACs 15 may be formed by a suitable deposition process, for example, but not limited to, CVD, PVD, or ALD. In some embodiments, each of the SACs 15 may have a thickness ranging from about 1 nm to about 80 nm. In some embodiments, each of the SACs 15 may have the bottom portion 151 and a top portion 152 extending upwardly from the bottom portion 151. The bottom portion 151 may have a thickness ranging from about 1 nm to about 50 nm, and the top portion 152 may have a thickness ranging from about 1 nm to about 30 nm.

In some embodiments, the gate spacers 16 may include, but not limited to, silicon oxide, silicon nitride, silicon carbide, silicon oxycarbide, silicon oxynitride, silicon carbonitride, silicon oxycarbonitride, or combinations thereof.

Other suitable materials for the gate spacers 16 are within the contemplated scope of the present disclosure. In some embodiments, the gate spacers 16 may be formed by a suitable deposition process, for example, but not limited to, CVD, PVD, or ALD. In some embodiments, each of the gate spacers 16 may include several layers.

In some embodiments, the metal contacts 17 may include, but not limited to, ruthenium, cobalt, molybdenum, tungsten, nickel, iridium, rhodium, osmium, or combinations thereof. Other suitable materials for the metal contacts 17 are within the contemplated scope of the present disclosure. In some embodiments, the metal contacts 17 may be formed by a suitable deposition process, for example, but not limited to, CVD, PVD, or ALD.

In some embodiments, the contact spacers 18 may include, but not limited to, silicon oxide, silicon nitride, silicon carbide, silicon oxycarbide, silicon oxynitride, silicon carbonitride, silicon oxycarbonitride, boron nitride, silicon boron nitride, or combinations thereof. Other suitable materials for the contact spacers 18 are within the contemplated scope of the present disclosure. In some embodiments, the contact spacers 18 may be formed by a suitable deposition process, for example, but not limited to, CVD, PVD, or ALD.

Figure 3:
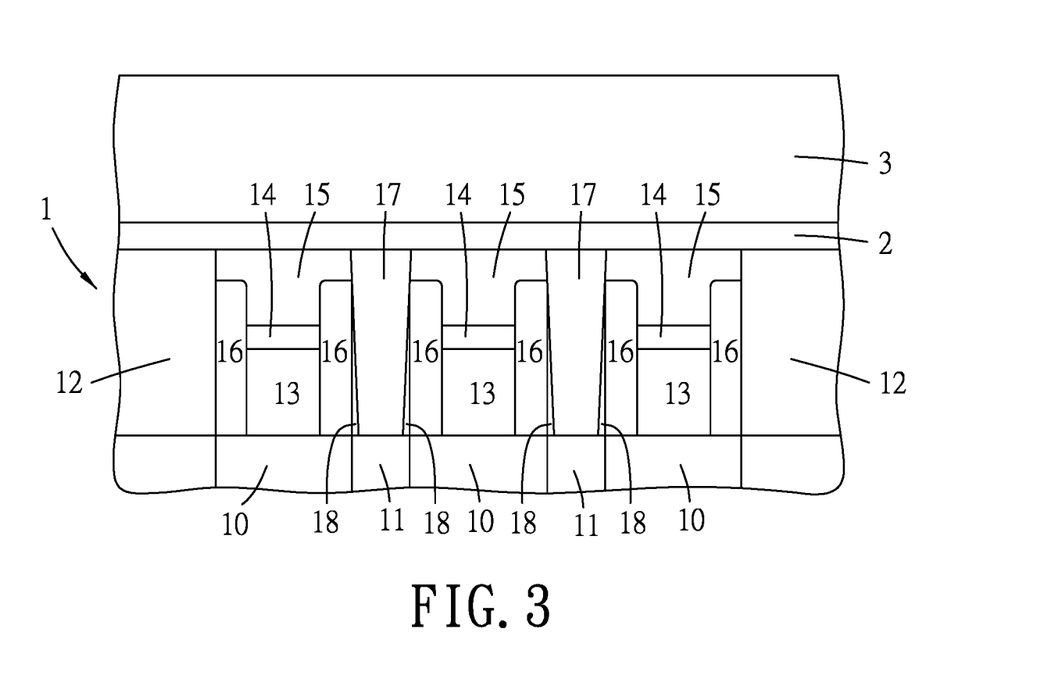

Referring to FIGS. 1 and 3, the method 100 proceeds to step 102, where an etch stop layer 2 and a second interlayer dielectric (ILD) layer 3 are sequentially formed on the semiconductor structure 1. In some embodiments, the etch stop layer 2 may include, but not limited to, lanthanum oxide, aluminum oxide, yttrium oxide, tantalum carbonitride, zirconium silicide, silicon oxycarbonitride, silicon oxycarbide, silicon carbonitride, zirconium nitride, zirconium aluminum oxide, titanium oxide, tantalum oxide, zirconium oxide, hafnium oxide, hafnium silicide, aluminum oxynitride, silicon nitride, silicon oxide, silicon carbide, zinc oxide, or combinations thereof. Other suitable materials for the etch stop layer 2 are within the contemplated scope of the present disclosure. In some embodiments, the etch stop layer 2 may be formed by a suitable deposition process, for example, but not limited to, CVD, PVD, ALD, HDPCVD, MOCVD, RPCVD, PECVD, or LPCVD. In some embodiments, the etch stop layer 2 may have a thickness ranging from about 3 nm to about 20 nm. The materials and processes for the second ILD layer 3 are similar to those for the first ILD layer 12 as described in step 101, and therefore, the details thereof are omitted for the sake of brevity. In some embodiments, the second ILD layer 3 may have a thickness ranging from about 3 nm to about 40 nm.

Figure 4:
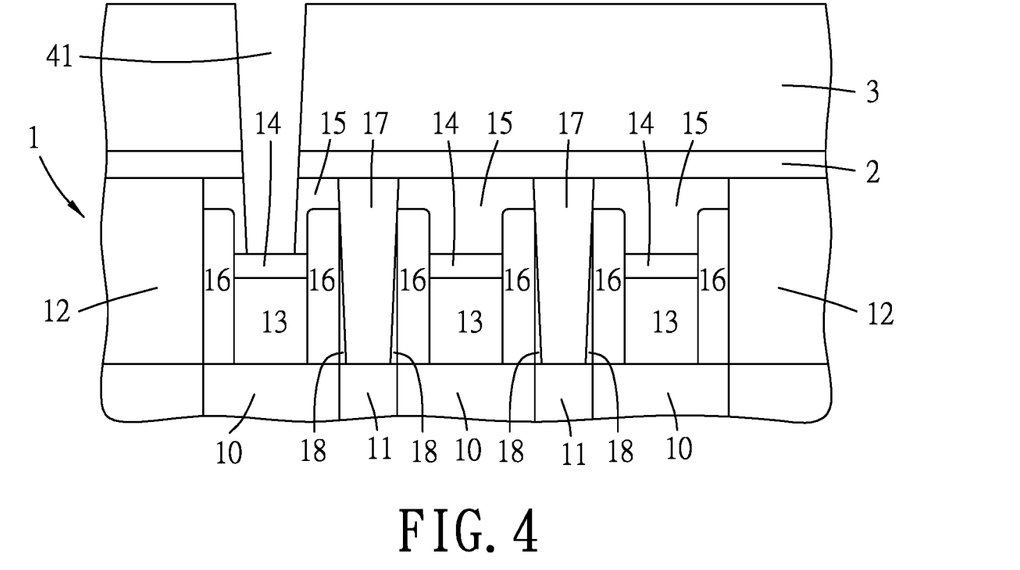

Referring to FIGS. 1 and 4, the method 100 proceeds to step 103, where a patterning process is conducted to form at least one trench 41 so as to expose a corresponding one of the metal caps 14. The trench 41 is defined by a trench-defining wall constituted by the second ILD layer 3, the etch stop layer 2, a corresponding one of the SACs 15, and the corresponding one of the metal caps 14. In some embodiments, the trench 41 may have an aspect ratio greater than 8. Step 103 may include (i) forming a patterned mask (not shown) on the second ILD layer 3 to partially expose the second ILD layer 3, (ii) etching the second ILD layer 3, the etch stop layer 2, and the corresponding one of the SACs 15 through the patterned mask to form the trench 41, and (iii) removing the patterned mask. The etching may be performed using dry etching, wet etching, or a combination thereof. The patterned mask may include a photoresist material or other suitable mask materials, and may be formed by coating a photoresist layer, soft-baking, exposing the photoresist layer through a photomask, post-exposure baking, and developing the photoresist layer, followed by hard-baking to thereby form the patterned mask.

Figure 5:
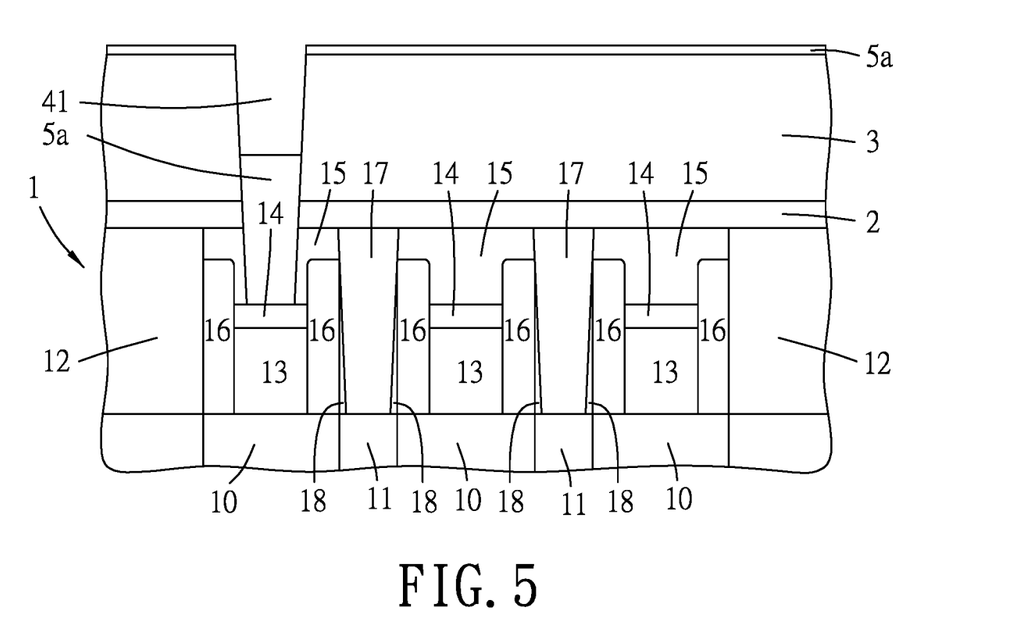

Referring to FIGS. 1 and 5, the method 100 proceeds to step 104, where a first contact layer 5a is formed on a top surface of the second ILD layer 3 and fills the trench 41. The first contact layer 5a may include, but not limited to, tungsten, ruthenium, aluminum, molybdenum, titanium, titanium nitride, titanium silicide, cobalt, cobalt silicide, nickel, nickel silicide, copper, tantalum nitride, or combinations thereof. Other suitable materials for the first contact layer 5a are within the contemplated scope of the present disclosure. The first contact layer 5a may be formed by a suitable deposition process, for example, but not limited to, CVD, PVD, or ALD.

Figure 6:
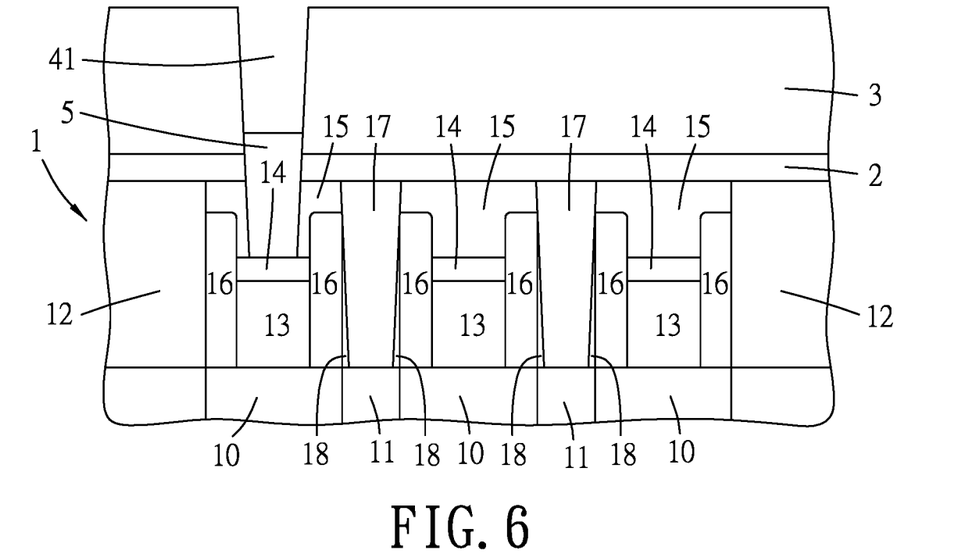

Referring to FIGS. 1 and 6, the method 100 proceeds to step 105, where the first contact layer 5a is etched back to form a first via contact feature 5 in the trench 41. The first via contact feature 5 is disposed on the metal cap 14 opposite to the metal gate 13, and is electrically connected to the metal gate 13. Step 105 may be performed using dry etching, wet etching, or a combination thereof. In some embodiments, the dry etching may be a plasma etching (for example, sputter etching, reactive ion etching (RIE), ion beam etching, combinations thereof, or other suitable plasma etching techniques). In some embodiments, the first contact layer 5a may be etched back using a gas plasma. In some embodiments, the gas plasma may be fluorine (F) or chlorine (Cl), or either fluorine (F) or chlorine (CL) combined with one of hydrogen ($H_2$), oxygen ($O_2$), nitrous oxide ($N_2O$), nitrogen ($N_2$), or another suitable gas. In some embodiments, the plasma generation power (for example, EF power) may range from about 100 W to about 300 W. In some embodiments, the plasma bias may range from about 100 V to about 800 V. In some embodiments, the plasma gas flow rate may range from about 10 sccm to about 300 sccm. In some embodiments, the plasma etching may be performed at a temperature ranging from about 20° C. to about 90° C. The etchant used in the wet etching may depend on the material of the first contact layer 5a. In some embodiments, when the first contact layer 5a is made of tungsten, the process for etching back the first contact layer 5a may include (i) oxidizing the first contact layer 5a using an agent (for example, deionized water ($DIO_3$)/diluted ammonia ($dNH_4OH$), or hydrogen peroxide ($H_2O_2$)/ammonia ($NH_4OH$)/water ($H_2O$)) to form a tungsten oxide layer (not shown), and then (ii) etching the tungsten oxide layer using an etchant (for example, $dNH_4OH$). In alternative embodiments, when the first contact layer 5a is made of ruthenium, the process for etching back the first contact layer 5a may be performed using an oxidizing agent (for example, periodic acid ($H_5IO_6$), or sodium hypochlorite (NaOCl)) having a pH value that is greater than about 10. In yet alternative embodiments, when the first contact layer 5a is made of molybdenum, the process for etching back the first contact layer 5a may include (i) oxidizing the first contact layer 5a using an agent (for example, $DIO_3$, $H_2O_2$, or nitric acid ($HNO_3$)) to form a molybdenum oxide layer (not shown), and then (ii) etching the molybdenum oxide layer using an etchant (for example, $dNH_4OH$, or phosphoric acid ($H_3PO_4$)). After this step, an upper surface of the first via contact feature 5 may have a cross section having a convex shape, a flat shape, or a concave shape. In some embodiments, the upper surface of the first via contact feature 5 may be located at a level higher than an upper surface of the etch stop layer 2 by a distance ranging from about 0.5 nm to about 5 nm. In some embodiments, the upper surface of the first via contact feature 5 may be located at a level lower than a lower surface of the etch stop layer 2 by a distance ranging from about 0.5 nm to about 5 nm. In some embodiments, the upper surface of the first via contact feature 5 may be located at a level between the upper and lower surfaces of the etch stop layer 2. In some embodiments, the first via contact feature 5 may have a thickness ranging from about 5 nm to about 40 nm measured from the corresponding one of the metal caps 14.

Figure 7:
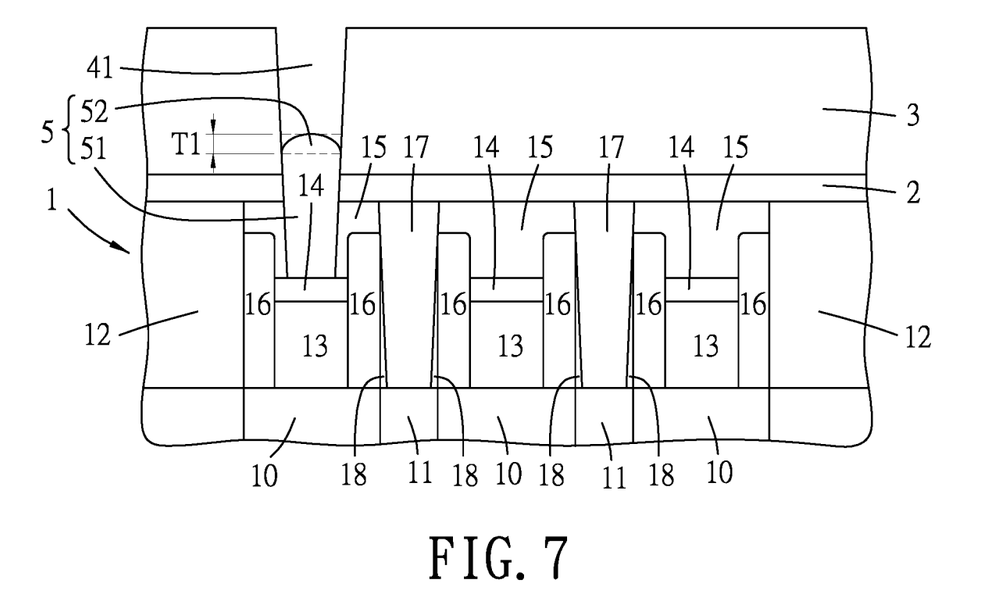
Figure 8:
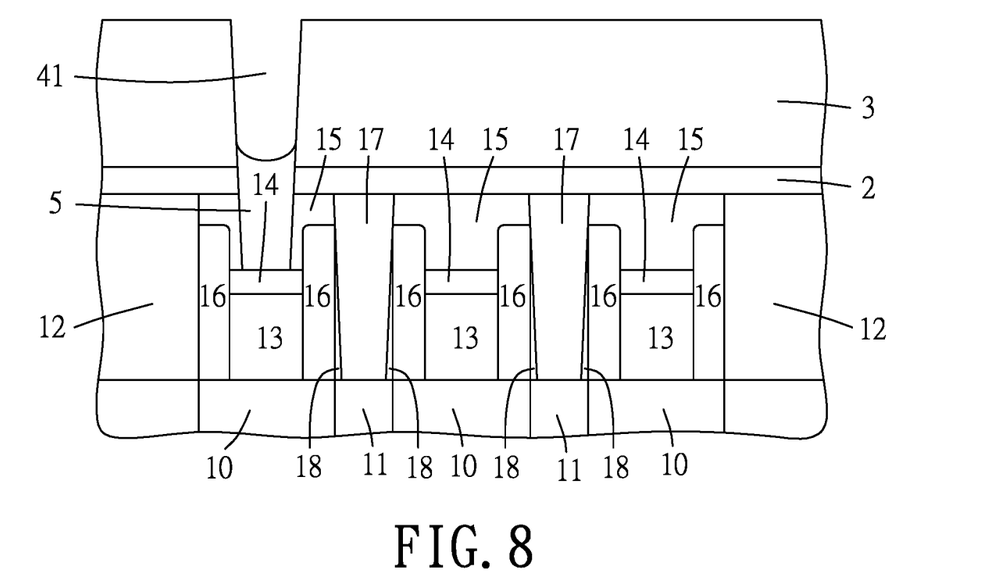

FIG. 7 illustrates that, in accordance with some embodiments, after formation of the first via contact feature 5 (for example, having a cross section of a convex shape), the structure shown in FIG. 6 may be subjected to a pre-clean procedure. In some embodiments, the structure shown in FIG. 6 may be pre-cleaned using hydrogen ($H_2$) plasma. In some embodiments, the hydrogen ($H_2$) plasma may be performed at a temperature ranging from about 30° C. to about 450° C. In some embodiments, the hydrogen ($H_2$) plasma may be performed under a pressure ranging from about 100 mT to about 20 T. In some embodiments, the plasma generation power (for example, radio frequency (RF) power) may range from about 200 W to about 800 W. After the pre-clean procedure, the cross section of the first via contact feature 5 may retain the same shape (i.e., convex shape). In some embodiments, the pre-clean procedure may be conducted by exposing the structure shown in FIG. 6 to tungsten hexafluoride ($WF_6$), followed by using the hydrogen ($H_2$) plasma. In some embodiments, the structure shown in FIG. 6 may be exposed to $WF_6$ at a temperature ranging from about 300° C. to about 500° C. In some embodiments, the first via contact feature 5 may be divided into a main portion 51 and a top curved portion 52 that protrudes from the main portion 51. In some embodiments, the top curved portion 52 of the first via contact feature 5 may have a thickness (T1) ranging from about 0.5 nm to about 10 nm.

In some embodiments, the structure shown in FIG. 6 may be pre-cleaned by wet cleaning to remove the oxidized portion of the first via contact feature 5. The etchant used in wet cleaning may depend on the materials of the first via contact feature 5. For example, when the first via contact feature 5 is made of tungsten, tungsten oxide produced by oxidation of tungsten of the first via contact feature 5 may be removed using $dNH_4OH$, $WF_6$, or a combination thereof, as the etchant. For another example, when the first via contact feature 5 is made of ruthenium, ruthenium oxide may be removed by $dNH_4OH$, tetramethylammonium hydroxide (TMAH), or a combination thereof. For yet another example, when the first via contact feature 5 is made of molybdenum, molybdenum oxide may be removed by $dNH_4OH$, $H_3PO_4$, molybdenum pentachloride ($MOCl_5$), or combinations thereof.

In some embodiments, the structure shown in FIG. 6 may be pre-cleaned by argon (Ar) sputter cleaning. In some embodiments, the argon (Ar) sputter cleaning may be performed at a temperature ranging from about 30° C. to about 450° C. In some embodiments, the argon (Ar) sputter cleaning may be performed under a pressure ranging from about 2 mT to about 50 mT. In some embodiments, the sputtering power (for example, RF power) may range from about 50 W to about 1000 W. When the argon (Ar) sputter cleaning is performed, the upper surface of the first via contact feature 5 may be etched by argon (Ar) ions to thereby become recessed (see FIG. 8). In some embodiments, the structure shown in FIG. 6 may be pre-cleaned sequentially by the hydrogen ($H_2$) plasma cleaning and the argon (Ar) sputter cleaning. The plasma generation source and the parameters for generating the hydrogen ($H_2$) plasma (for example, the plasma generation power, temperature, or pressure) may be similar to those used in the hydrogen ($H_2$) plasma cleaning described above. After the hydrogen ($H_2$) plasma cleaning and the argon (Ar) sputter cleaning are performed, residues (for example, silicon or oxygen atoms released from the second ILD layer 3 contacted by the argon (Ar) atoms) may be found on the trench-defining wall of the trench 41. In some embodiments, when the first via contact feature 5 is made of tungsten, the structure shown in FIG. 6 may be pre-cleaned sequentially by exposing the structure shown in FIG. 6 to $WF_6$, followed by conducting the argon (Ar) sputter cleaning. Afterwards, the residues (for example, fluorine atoms left after the $WF_6$ treatment, and silicon or oxygen atoms released from the second ILD layer 3 contacted by the argon (Ar) atoms) may be found on the trench-defining wall of the trench 41.

Figure 9:
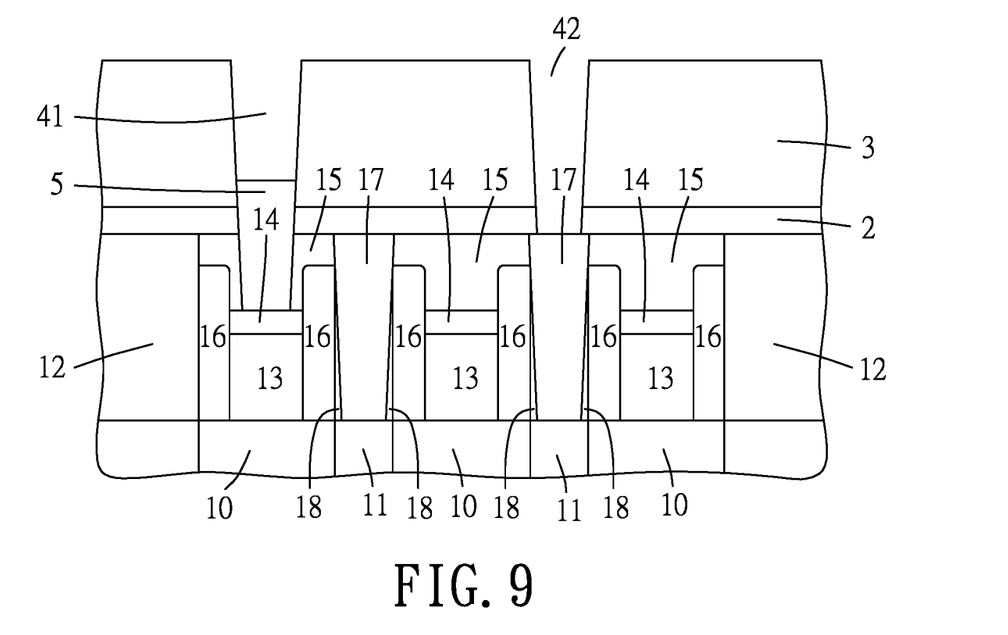

Referring to FIGS. 1 and 9, the method 100 proceeds to step 106, where a patterning process is performed to form a trench 42 and to expose a corresponding one of the metal contacts 17. The trench 42 may be performed using a photolithography process and an etching process similar to those described in step 103.

Figure 10:
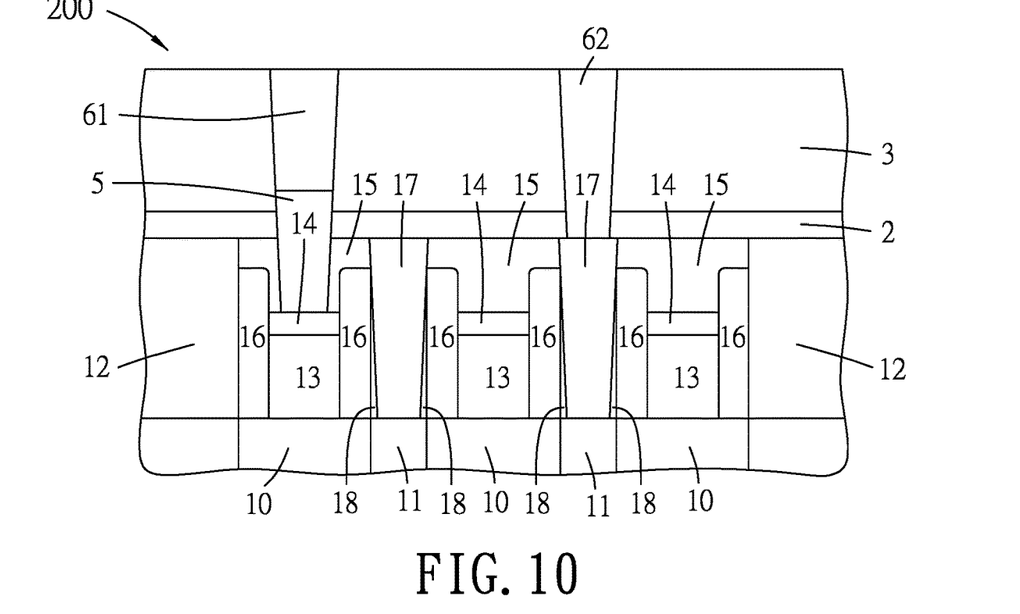

Referring to FIGS. 1 and 10, the method 100 proceeds to step 107, where second via contact features 61, 62 are formed on the top surface of the first via contact feature 5 that is exposed in the trench 41 (see FIG. 9), and in the trench 42 (see FIG. 9), respectively. Step 107 may include (i) depositing a second contact layer (not shown) over the structure of FIG. 9 to fill the trenches 41, 42, and (ii) conducting a planarization process, such as a chemical mechanical polishing (CMP) process or other suitable techniques, to remove the second contact layer on the top surface of the second ILD layer 3, so as to obtain the second via contact features 61, 62. The second via contact features 61, 62 may include, but are not limited to, tungsten, ruthenium, aluminum, molybdenum, titanium, titanium nitride, titanium silicide, cobalt, cobalt silicide, nickel, nickel silicide, copper, tantalum nitride, or combinations thereof. Other suitable materials for the second via contact features 61, 62 are within the contemplated scope of the present disclosure. In some embodiments, each of the second via contact features 61, 62 may have a thickness ranging from about 5 nm to about 40 nm. In some embodiments, the first via contact feature 5 and the second via contact features 61, 62 are made of different materials. After this step, the semiconductor device 200 is obtained. The first via contact feature 5 and the second via contact feature 61 in the trench 41 cooperate to form a via contact that penetrates through the second ILD layer 3 and terminates at the corresponding one of the metal gates 13.

Figure 11:
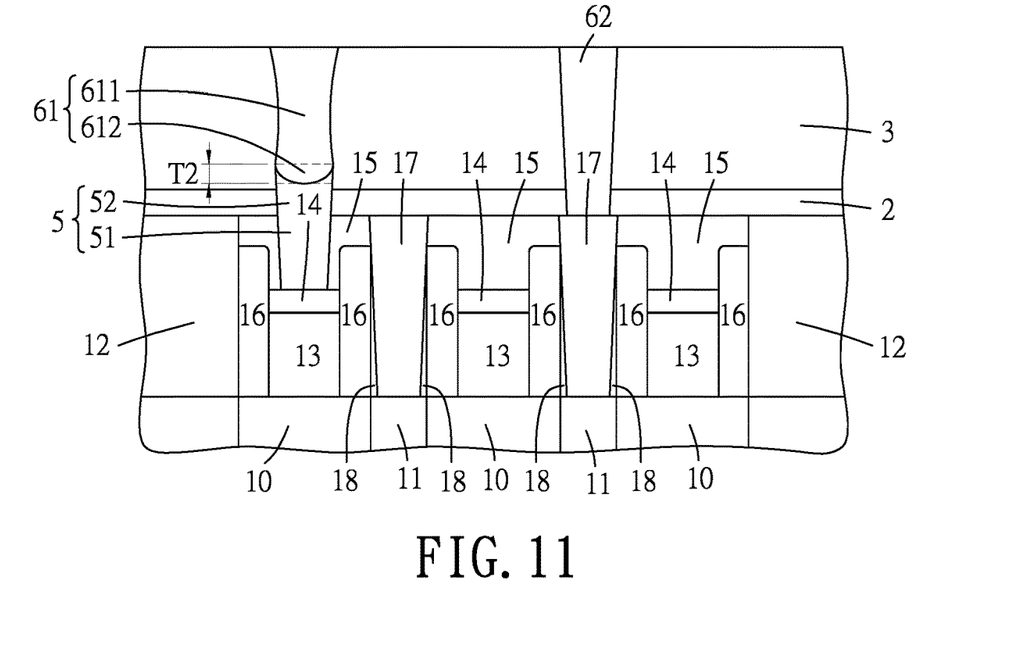
FIGS. 11 to 21 illustrate various examples of a semiconductor device in accordance with some embodiments.

FIG. 11 illustrates that, in accordance with some embodiments, when the argon (Ar) sputter cleaning is conducted to clean the structure shown in FIG. 6, the second via contact feature 61 formed thereafter (i.e., step 107 in the flow chart 100 shown in FIG. 1) on the first via contact feature 5 may be divided into a main portion 611 and a bottom curved portion 612 that extends downwardly from the main portion 611 and is in contact with the top curved portion 52 of the first via contact feature 5. In some embodiments, a side of the main portion 611 of the second via contact feature 61 may be laterally recessed (namely, a necking profile), which is caused by the residues (e.g., silicon, oxygen, or fluorine atoms) present on the trench-defining wall of the trench 41 (see FIG. 9) after the argon (Ar) sputter cleaning as previously mentioned. In some embodiments, the bottom curved portion 612 of the second via contact feature 61 may have a thickness (T2) ranging from about 0.5 nm to about 10 nm.

Figure 12:
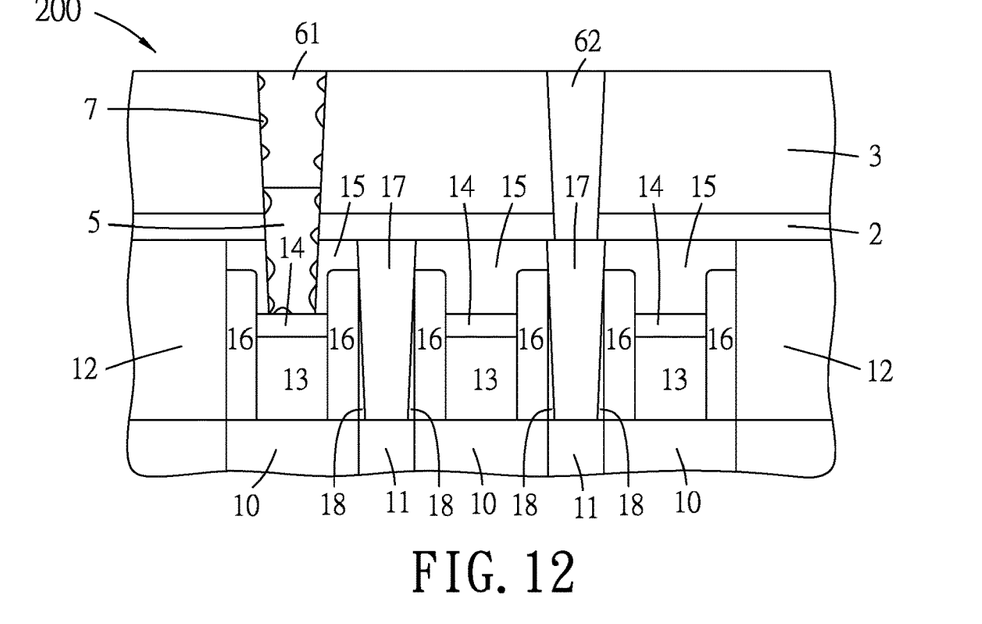

FIG. 12 illustrates that, in accordance with some embodiments, the via contact may further include a glue layer 7 that is formed on the trench-defining wall and surrounds the first via contact feature 5 and the second via contact feature 61. In some embodiments, the glue layer 7 may also be formed to surround the second via contact feature 62. In some embodiments, the glue layer 7 may be formed as a discontinuous structure. In this embodiment, the glue layer 7 is formed as island-like structures. In some embodiments, the glue layer 7 may be made of an electrically conductive material, such as, but not limited to, cobalt, tungsten, ruthenium, aluminum, molybdenum, titanium, titanium nitride, titanium silicide, titanium oxide, cobalt silicide, nickel silicide, copper, tantalum nitride, or combinations thereof. Other suitable materials for the glue layer 7 are within the contemplated scope of the present disclosure.

Figure 13:
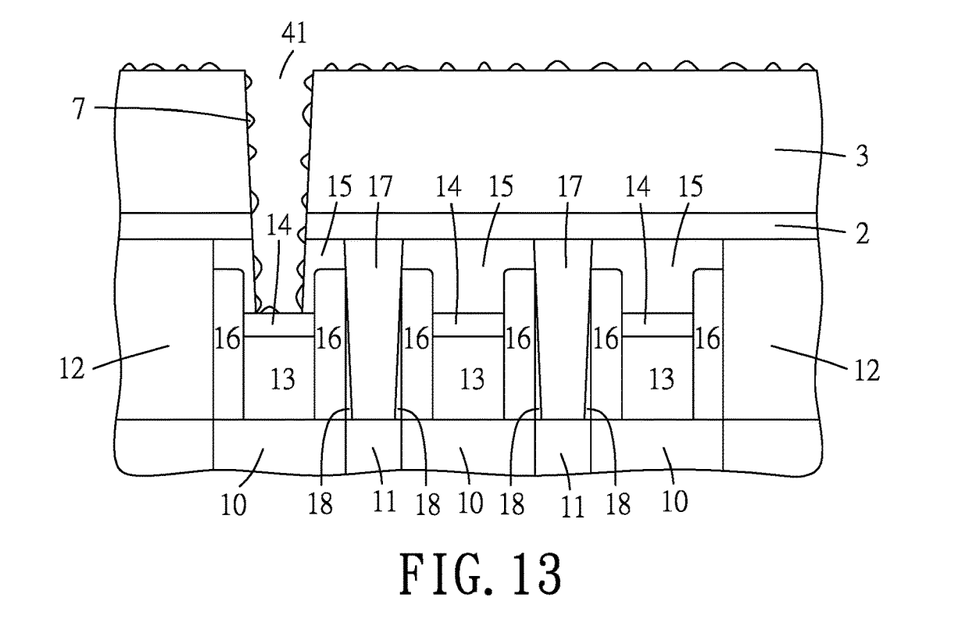

FIG. 13 illustrates that, in some embodiments, after the formation of the trench 41 (i.e., step 103 in the flow chart 100 shown in FIG. 1) and before forming the first contact layer 5*a* in the trench 41 (i.e., step 104 in the flow chart 100 shown in FIG. 1), the glue layer 7 may be formed on the trench-defining wall of the trench 41 and on the top surface of the second ILD layer 3. In some embodiments, the glue layer 7 may be formed by a suitable deposition process, for example, but not limited to, CVD, PVD, or ALD. After formation of the glue layer 7, the glue layer 7 deposited on the top surface of the second ILD layer 3 may be removed using dry etching, wet etching, CMP or combinations thereof. Afterwards, steps 104 to 107 can be performed to obtain the semiconductor device 200 as shown in FIG. 12. The glue layer 7 may serve as a nucleation promotor to enhance the adhesion between the first via contact feature 5 and the trench-defining wall, and/or the adhesion between the second via contact feature 61 and the trench-defining wall.

Figure 14:
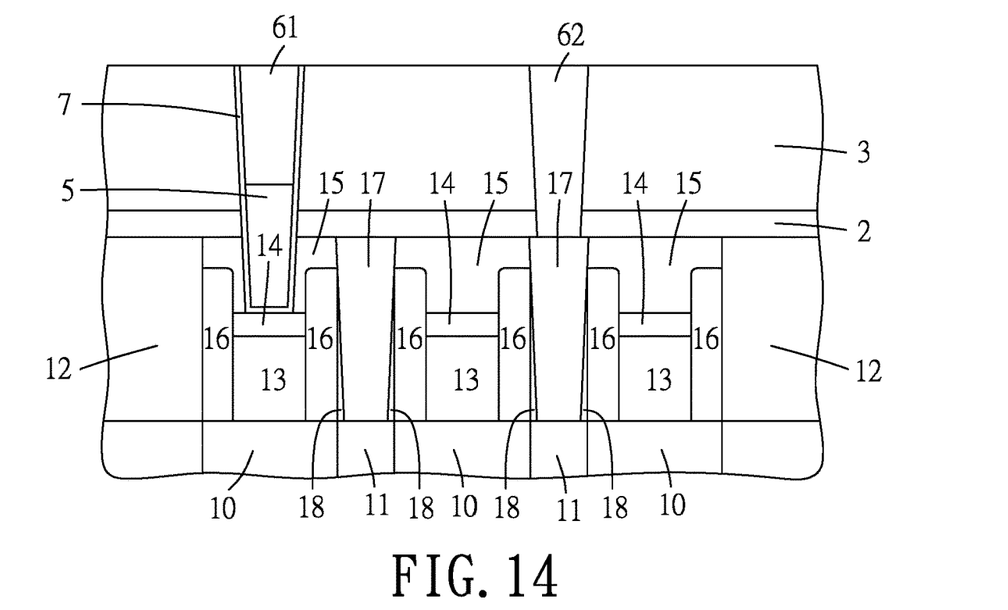

FIG. 14 illustrates that, in accordance with some embodiments, the glue layer 7 may be formed as a continuous structure (i.e., a thin film) disposed on the trench-defining wall to surround the first via contact feature 5 and the second via contact feature 61 in the trench 41.

Figure 15:
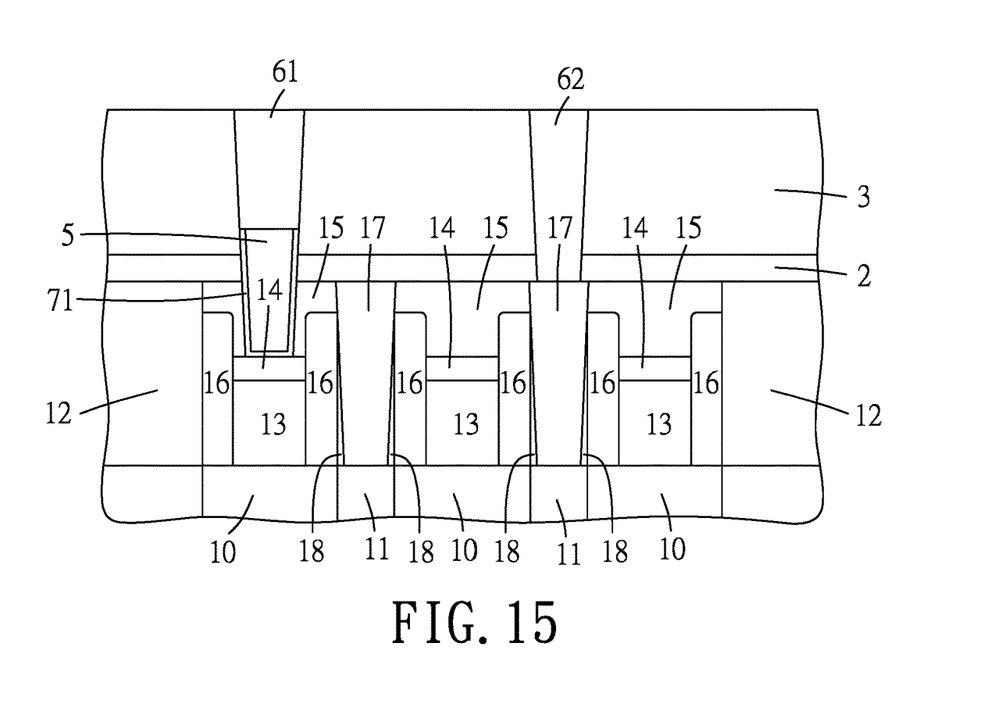
Figure 16:
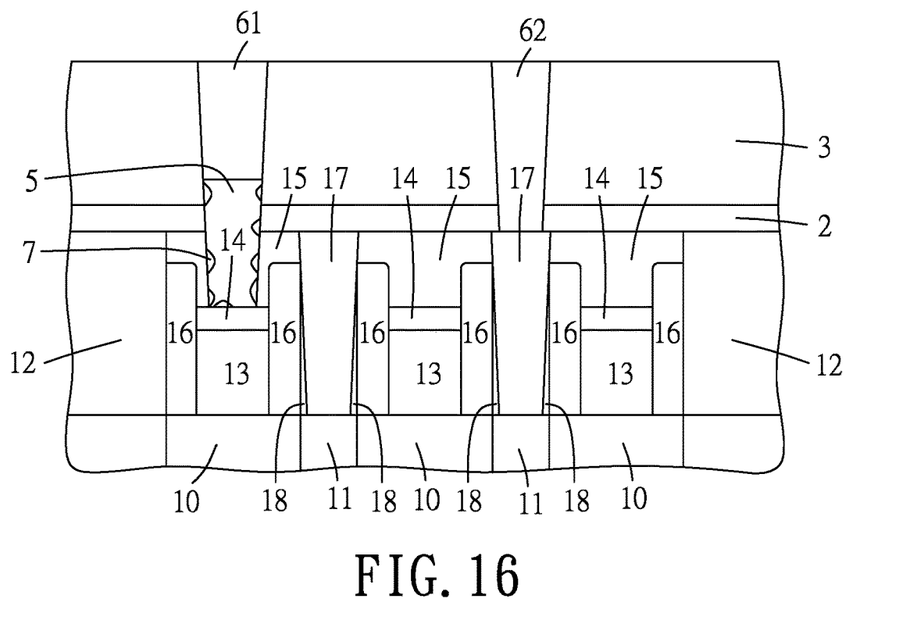

FIGS. 15 and 16 illustrate that, in accordance with some embodiments, after the formation of the glue layer 7 and the first via contact feature 5, and before the formation of the second via contact feature 61, a portion of the glue layer 7 that is disposed on an upper portion of the trench 41 and that is not covered by the first via contact feature 5 is removed to form a first glue layer 71 that only surrounds the first via contact feature 5 in the trench 41. The portion of the glue layer 7 may be removed using dry etching, wet etching, a combination thereof, or other suitable techniques. As mentioned above, the first glue layer 71 may be formed as a thin film (see FIG. 15) or island-like structures (see FIG. 16). The second via contact feature 61 is then formed on the first via contact feature 5.

Figure 17:
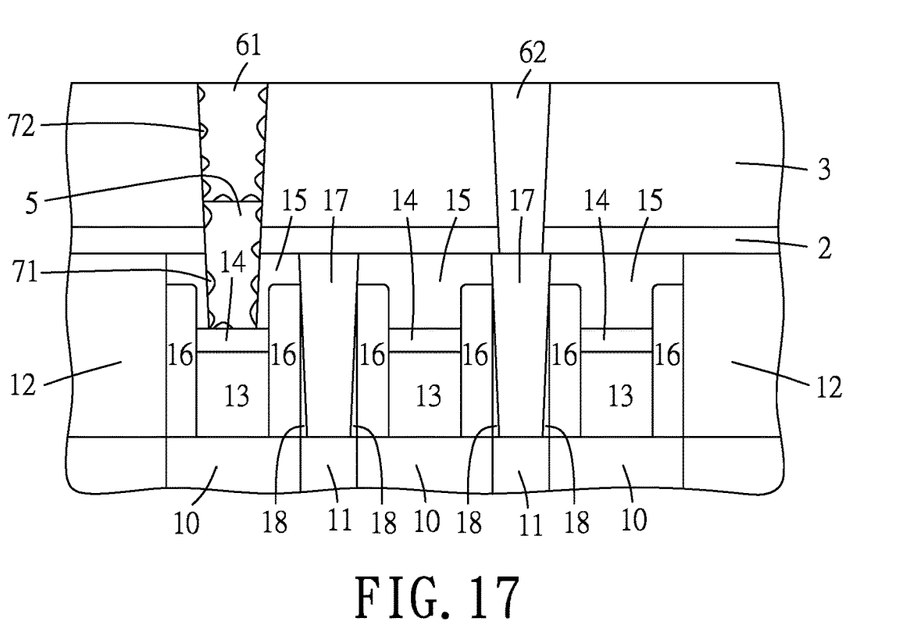
Figure 18:
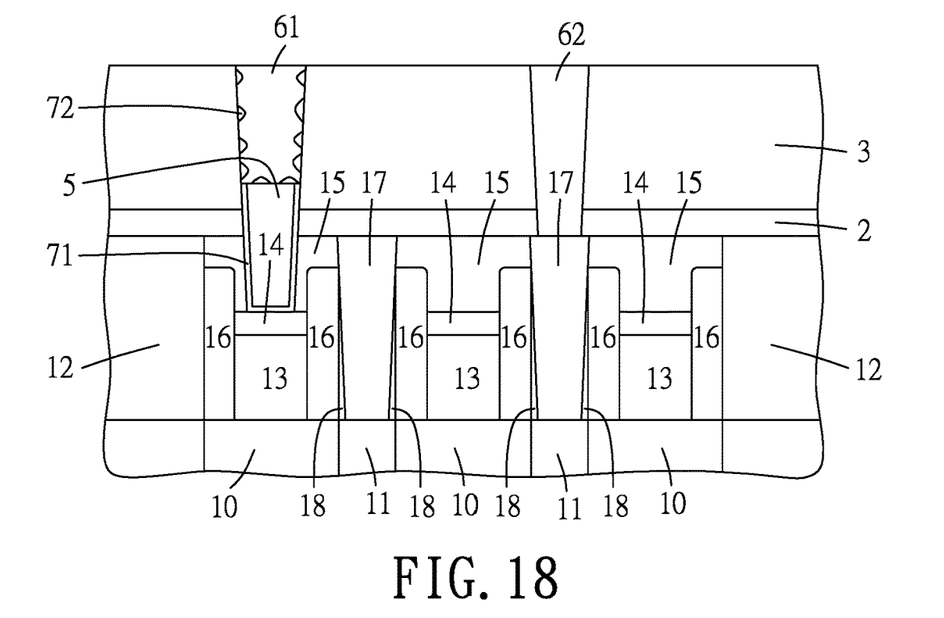
Figure 19:
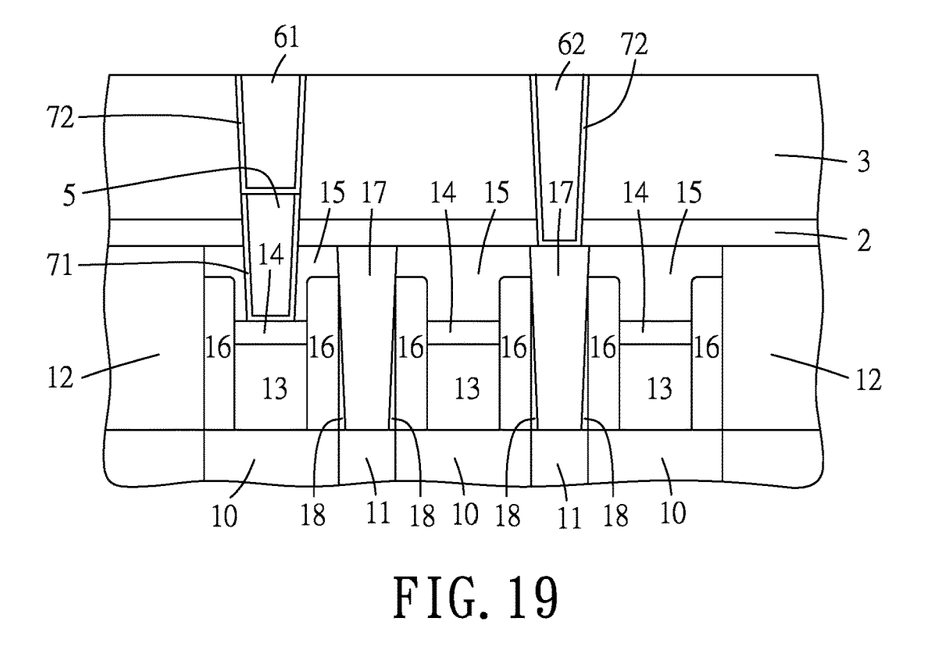

FIGS. 17 to 19 illustrate that, in accordance with some embodiments, the via contact further includes the first glue layer 71 that surrounds the first via contact feature 51, and a second glue layer 72 that surrounds the second via contact feature 61. In some embodiments, each of the first glue layer 71 and the second glue layer 72 is formed as a discontinuous structure (i.e., a plurality of island-like structures, see FIG. 17). In some embodiments, one of the first glue layer 71 and the second glue layer 72 may be formed as a discontinuous structure, and the other one of the first glue layer 71 and the second glue layer 72 may be formed as a continuous structure. For example, as shown in FIG. 18, the first glue layer 71 is formed as a thin film, and the second glue layer 72 is formed as island-like structures. In some embodiments, each of the first glue layer 71 and the second glue layer 72 is formed as a thin film (see FIG. 19). In this embodiment, the second glue layer 72 may be optionally formed on the trench-defining wall that defines the trench 42 (see FIG. 9) to surround the second via contact feature 62 in the trench 42. In some embodiments, each of the first glue layer 71 and the second glue layer 72 may have a thickness ranging from about 1 Å to about 30 Å. In some embodiments, the percentage of an area of the trench-defining wall occupied by the glue layer 7, the first glue layer 71, or the first and second glue layers 71, 72 based on a total surface area of the trench-defining wall may range from about 0% to about 99%.

Figure 20:
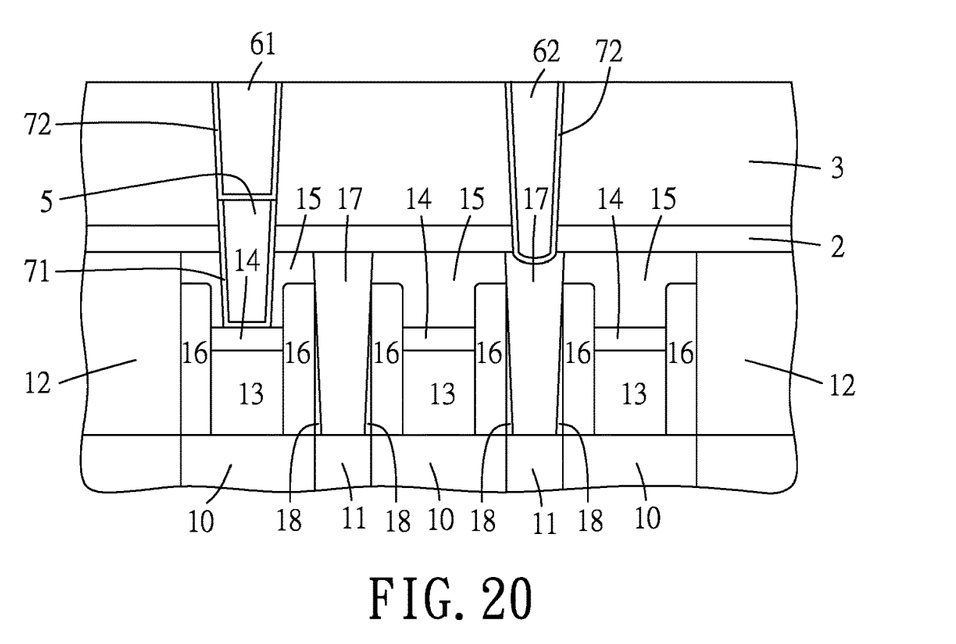

Referring to FIG. 20, in accordance with some embodiments, the trench 42 (see FIG. 9) may extend into the corresponding one of the metal contacts 17 (i.e., step 106 shown in the flowchart 100 shown in FIG. 1). In some embodiments, the depth of the trench 42 that extends into the corresponding one of the metal contacts 17 may range from about 0.5 nm to about 3 nm. Afterwards, step 107 in the flowchart 100 shown in FIG. 1 can be performed, such that the second glue layer 72 and the second via contact feature 62 are formed on the corresponding one of the metal contacts 17.

Figure 21:
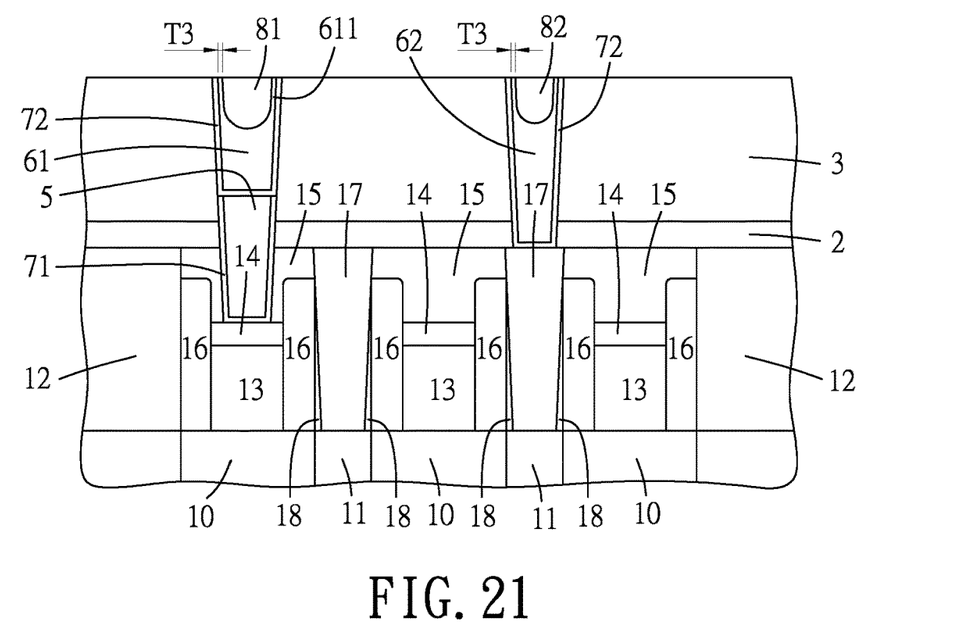

Referring to FIG. 21, in accordance with some embodiments, the via contact further includes a third via contact feature 81 that is disposed on the second via contact feature 61 opposite to the first via contact feature 5. The third via contact feature 81, the second via contact feature 61, and the first via contact feature 5 may be made of the same or different materials. The process for forming the third via contact feature 81 may include (i) partially removing an upper portion of the second via contact feature 61 in the trench 41 (see FIG. 9) using an etching process similar to those described in step 105 to form a trench (now shown), (ii) depositing a third contact layer (not shown) in the trench and on the top surface of the second ILD layer 3 using a suitable deposition technique, and then (iii) conducting a planarization process, such as a CMP process or other suitable techniques, to remove the third contact layer on the top surface of the second ILD layer 3, so as to obtain the third via contact feature 81 formed on the second via contact feature 61 in the trench 41. In some embodiments, an additional third via contact feature 82 may be formed in the second via contact feature 62 in the trench 42 (see FIG. 9). In some embodiments, the etched upper portion 611 of the second via contact feature 61 may have a thickness (T3) ranging from about 1 nm to about 20 nm.

In this disclosure, by sequentially forming the first via contact feature, etching back the first via contact feature, and forming the second via contact feature on the first via contact feature, formation of defects (for example, a void, a seam or a sidewall groove) might be avoided in the via contact.

In accordance with some embodiments of the present disclosure, a method for manufacturing a semiconductor device includes: forming a conductive feature in a first dielectric layer; forming a second dielectric layer on the first dielectric layer; forming a trench that penetrates through the second dielectric layer, and terminates at the conductive feature; forming a contact layer in the trench and on the conductive feature; etching back the contact layer to form a first via contact feature in the trench, the first via contact feature being electrically connected to the conductive feature; and forming a second via contact feature on the first via contact feature in the trench.

In accordance with some embodiments of the present disclosure, etching back the contact layer is conducted using a gas plasma.

In accordance with some embodiments of the present disclosure, the gas plasma includes fluorine, chlorine or combinations thereof.

In accordance with some embodiments of the present disclosure, the method for manufacturing a semiconductor device further includes, after forming the conductive feature and before forming the second dielectric layer, forming an etch stop layer on the first dielectric layer so that, after forming the second dielectric layer, the etch stop layer is disposed between the first dielectric layer and the second dielectric layer, an upper surface of the first via contact feature being located at a level higher than an upper surface of the etch stop layer.

In accordance with some embodiments of the present disclosure, the upper surface of the first via contact feature has a cross section having a convex shape In accordance with some embodiments of the present disclosure, the method for manufacturing a semiconductor device further includes, after etching back the contact layer and before forming the second via contact feature, pre-cleaning a trench-defining wall that defines the trench by argon sputter cleaning, hydrogen plasma cleaning, wet cleaning or combinations thereof.

In accordance with some embodiments of the present disclosure, pre-cleaning the trench-defining wall is performed using the argon sputter cleaning, and, after pre-cleaning the trench-defining wall, the first via contact feature has a recessed upper surface.

In accordance with some embodiments of the present disclosure, the method for manufacturing a semiconductor device further includes, after forming the trench and before forming the contact layer in the trench, forming a glue layer on a trench-defining wall that defines the trench.

In accordance with some embodiments of the present disclosure, the glue layer is formed as a discontinuous structure.

In accordance with some embodiments of the present disclosure, a method for manufacturing a semiconductor device includes: forming a metal gate in a dielectric layer; forming a trench that penetrates through the dielectric layer, and terminates at the metal gate; forming a glue layer on a trench-defining wall that defines the trench; forming a contact layer in the trench and on the metal gate, the contact layer being surrounded by the glue layer; etching back the contact layer to form a first via contact feature in the trench, the first via contact feature being electrically connected to the metal gate; and forming a second via contact feature that is disposed on the first via contact feature in the trench.

In accordance with some embodiments of the present disclosure, the method for manufacturing a semiconductor device further includes, before forming the second via contact feature, removing a portion of the glue layer that is exposed from the first via contact feature so as to form a first glue layer that surrounds the first via contact feature.

In accordance with some embodiments of the present disclosure, the method for manufacturing a semiconductor device, after removing the portion of the glue layer and before forming the second via contact feature, forming a second glue layer on the trench-defining wall that is exposed from the first via contact feature.

In accordance with some embodiments of the present disclosure, a semiconductor device includes a first dielectric layer, a conductive feature, a second dielectric layer, and a via contact. The conductive feature is disposed in the first dielectric layer. The second dielectric layer is disposed over the first dielectric layer. The via contact penetrates through the second dielectric layer and terminates at the conductive feature. The via contact includes a first via contact feature that is disposed on and electrically connected to the conductive feature, and a second via contact feature that is disposed on the first via contact feature opposite to the conductive feature.

In accordance with some embodiments of the present disclosure, the semiconductor device further includes an etch stop layer disposed between the first dielectric layer and the second dielectric layer. An upper surface of the first via contact feature is located at a level higher than an upper surface of the etch stop layer.

In accordance with some embodiments of the present disclosure, the first via contact feature and the second via contact feature are made of different materials.

In accordance with some embodiments of the present disclosure, the via contact further includes a glue layer that surrounds the first via contact feature and the second via contact feature.

In accordance with some embodiments of the present disclosure, the glue layer is formed as a discontinuous structure.

In accordance with some embodiments of the present disclosure, the via contact further includes a first glue layer that surrounds the first via contact feature, and a second glue layer that surrounds the second via contact feature.

In accordance with some embodiments of the present disclosure, one of the first glue layer and the second glue layer is formed as a discontinuous structure, and the other one of the first glue layer and the second glue layer is formed as a continuous layer.

In accordance with some embodiments of the present disclosure, the via contact further includes a third via contact feature that is disposed on the second via contact feature opposite to the first via contact feature.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a conductive feature in a first dielectric layer;
   forming a second dielectric layer on the first dielectric layer;
   forming a trench that penetrates through the second dielectric layer, and terminates at the conductive feature;
   forming a contact layer in the trench and on the conductive feature;
   etching back the contact layer to form a first via contact feature in the trench, the first via contact feature being electrically connected to the conductive feature; and
   forming a second via contact feature in the trench, the second via contact feature being disposed on the first via contact feature.

2. The method according to claim 1, wherein etching back the contact layer is conducted using a gas plasma.

3. The method according to claim 2, wherein the gas plasma includes fluorine, chlorine, or a combination thereof.

4. The method according to claim 1, further comprising, after forming the conductive feature and before forming the second dielectric layer, forming an etch stop layer on the first dielectric layer so that, after forming the second dielectric layer, the etch stop layer is disposed between the first dielectric layer and the second dielectric layer, an upper surface of the first via contact feature being located at a level higher than an upper surface of the etch stop layer.

5. The method according to claim 4, wherein the upper surface of the first via contact feature has a cross section having a convex shape.

6. The method according to claim 1, further comprising, after etching back the contact layer and before forming the second via contact feature, pre-cleaning a trench-defining wall that defines the trench by argon sputter cleaning, hydrogen plasma cleaning, wet cleaning or combinations thereof.

7. The method according to claim 6, wherein pre-cleaning the trench-defining wall is performed using the argon sputter cleaning, and, after pre-cleaning the trench-defining wall, the first via contact feature has a recessed upper surface.

8. The method according to claim 1, further comprising, after forming the trench and before forming the contact layer in the trench, forming a glue layer on a trench-defining wall that defines the trench.

9. The method according to claim 8, wherein the glue layer is formed as a discontinuous structure.

10. A method for manufacturing a semiconductor device, comprising:
forming a metal gate in a dielectric layer;
forming a metal cap on the metal gate;
forming a trench that penetrates through the dielectric layer, and terminates at the metal cap;
forming a contact layer in the trench and on the metal cap;
etching back the contact layer to form a first via contact feature in the trench, the first via contact feature being electrically connected to the metal gate; and
forming a second via contact feature in the trench, the second via contact feature being disposed on the first via contact feature.

11. The method according to claim 10, wherein the metal cap includes tungsten, cobalt, ruthenium, titanium nitride, fluorine-free tungsten, or combinations thereof.

12. The method according to claim 10, wherein the metal cap is formed in the dielectric layer.

13. A method for manufacturing a semiconductor device, comprising:
forming a conductive feature in the first dielectric layer;
forming a second dielectric layer on the first dielectric layer;
forming a trench that penetrates the second dielectric layer and the first dielectric layer to expose an upper surface of the conductive feature;
forming a first glue layer on the upper surface of the conductive feature and a lower portion of a trench-defining wall that defines the trench;
forming a first via contact feature on the first glue layer and in the trench;
forming a second glue layer on the first glue layer, the first via contact feature, and an upper portion of the trench-defining wall disposed above the lower portion of the trench-defining wall; and
forming a second via contact feature to fill the trench, the second via contact feature being disposed on a sidewall and a bottom of the second glue layer.

14. The method according to claim 13, wherein one of the first glue layer and the second glue layer is formed as a continuous structure, and the other one of the first glue layer and the second glue layer is formed as a discontinuous structure.

15. The method according to claim 14, wherein the continuous structure is a thin film structure, and the discontinuous structure is formed as a plurality of island-like structures.

16. The method according to claim 13, wherein formation of the first via contact feature includes
forming a contact layer on the first glue layer and in the trench, and
etching back the contact layer to form the first via contact feature.

17. The method according to claim 16, wherein the contact layer is made of tungsten, ruthenium, aluminum, molybdenum, titanium, titanium nitride, titanium silicide, cobalt, cobalt silicide, nickel, nickel silicide, copper, tantalum nitride, or combinations thereof.

18. The method according to claim 16, wherein the contact layer is made of tungsten, and etching back the contact layer is conducted by a wet etching process including
oxidizing the contact layer using a combination of deionized water and diluted ammonia, a combination of hydrogen peroxide, ammonia, and water, or a combination thereof, so as to form the contact layer into an oxidized contact layer, and
etching the oxidized contact layer using diluted ammonia.

19. The method according to claim 16, wherein the contact layer is made of ruthenium, and etching back the contact layer is conducted by using an oxidizing agent that includes periodic acid or sodium hypochlorite.

20. The method according to claim 16, wherein the contact layer is made of molybdenum, and etching back the contact layer is conducted by a wet etching process including
oxidizing the contact layer using deionized water, hydrogen peroxide, nitric acid, or combinations thereof, so as to form the contact layer into an oxidized contact layer, and
etching the oxidized contact layer using diluted ammonia, phosphoric acid, or a combination thereof.

* * * * *